United States Patent [19]

Tragen

[11] Patent Number: 4,739,445
[45] Date of Patent: Apr. 19, 1988

[54] ELECTRONIC COMPUTER CABINETRY HAVING FAN AND POWER SUPPLY DRAWERS AND CONNECTOR PORT ARRANGEMENT

[75] Inventor: Barry J. Tragen, Forest Grove, Oreg.

[73] Assignee: Microscience Corporation, Dunwoody, Ga.

[21] Appl. No.: 760,263

[22] Filed: Jul. 29, 1985

[51] Int. Cl.⁴ .............................................. H05K 7/20
[52] U.S. Cl. .................. 361/384; 174/16 R; 361/391
[58] Field of Search ............. 62/418; 174/16 R; 361/381, 383, 384, 390, 391

[56] References Cited

U.S. PATENT DOCUMENTS

| 3,656,058 | 4/1972 | Leathers | 361/390 |
| 4,356,531 | 10/1982 | Marino et al. | 361/384 |
| 4,388,671 | 5/1983 | Hall et al. | 361/391 |

FOREIGN PATENT DOCUMENTS

| 0152093 | 8/1985 | European Pat. Off. | 361/383 |
| 2416103 | 10/1975 | Fed. Rep. of Germany | 361/384 |
| 1460759 | 1/1977 | United Kingdom | 361/391 |

Primary Examiner—A. D. Pellinen
Assistant Examiner—Gregory D. Thompson
Attorney, Agent, or Firm—Jim Zegeer

[57] ABSTRACT

The internal electric fans for circulating and removing cooling air for electronic equipment and the power supply are mounted on fan and power supply drawers which are guided into and out of position in the cabinet for the equipment by pairs of spaced parallel guide rails, respectively. When the cabinet protects an electronic contention switcher having a plurality of computer ports, the computer ports are constituted by elongated socket connectors which are all mounted at an angle to the vertical.

3 Claims, 2 Drawing Sheets

ELECTRONIC COMPUTER CABINETRY HAVING FAN AND POWER SUPPLY DRAWERS AND CONNECTOR PORT ARRANGEMENT

BACKGROUND OF THE INVENTION

This invention relates to cabinetry for electronic equipment, and more particularly, to a mounting arrangement for electric cooling fans which circulate cooling air around the components of electronic equipment. Where electronic components are mounted in a closed cabinet, electric blower fans are used to cause cooling air to circulate around the electronic components to ensure long life and stable operation. Since the fans generally run continuously during operation of the electronic equipment, the fans require maintenance and at times replacement. When the fans are mounted internally in the cabinet, the circuit boards and components have to be removed to gain access to the fans.

The object of the present invention is to provide improvement in cabinets for electronic equipment, and more particularly in the maintenance system for cooling fans for cabinet enclosed electronic equipment. According to the invention, one or more fans are mounted on a plate rack forming a fan drawer which is guided by a pair of spaced guide rails which guide the fan drawer into position so the fans can be quickly and easily removed for service or replacement without having to remove the electronic components from the protective cabinet.

DESCRIPTION OF THE DRAWINGS

The above and other objects, advantages and features of the invention will become more apparent when considered with the following specification taken in conjunction with the accompanying drawings wherein.

DETAILED DESCRIPTION OF THE INVENTION

Figure 1:
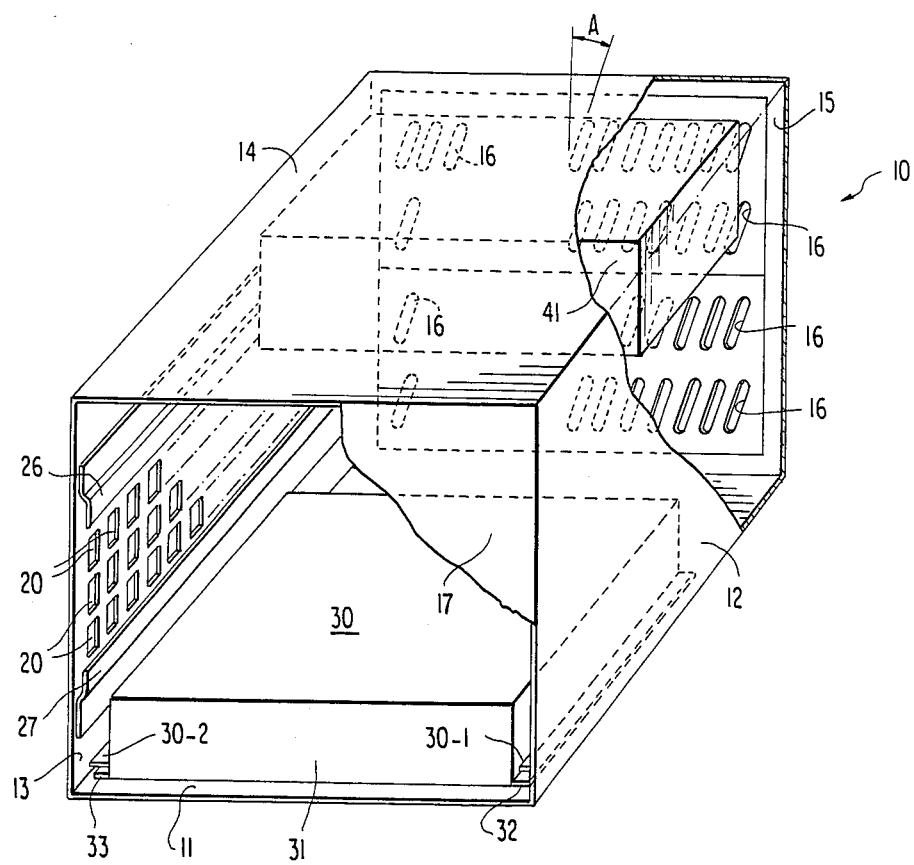
FIG. 1a is an isometric view of an electronic cabinet incorporating the invention showing some of the electronic components therein.
FIG. 1b is a partial rear view of two rows of sixteen standard RS232 connector sockets 16 shown in FIG. 1a, and FIG. 2 is an isometric view of the electronic cabinet shown in FIG. 1a with only the fan drawer in position.
Figure 2:
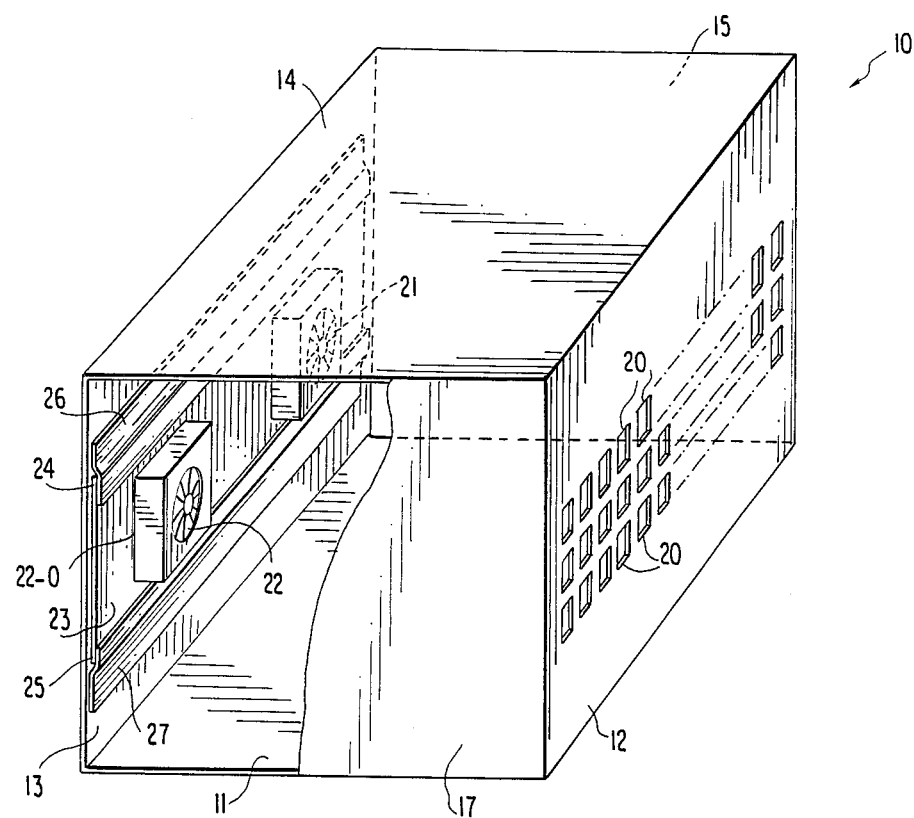

Referring to FIG. 1, cabinet 10 may be metal or plastic and of any general configuration but is typically rectangular. A base 11, two vertical sides 12 and 13, a top 14, a first end or rear wall 15 which has various electrical connector sockets or ports 16 and a second end wall or cover 17 (FIG. 2) which is removably secured to sides 12, 13, top 14 and base 11 panel by fasteners (not shown) so that access can be had to electronic circuitboards and components for servicing repair, modifications, etc. It will be appreciated that any of the sides or walls may be removable with the fan drawer constituted by rack plate 23, described later, is moved in a direction normal thereto.

The sidewalls 13 and 14 (in this disclosed embodiment) have a plurality of slots or louvers 20 to permit the air to be drawn into the unit for cooling electronic equipment contained therein. According to the invention, the fans or blowers 21 and 22 (FIG. 2), which preferably are of the flat or pancake variety, are mounted on fan drawer constituted by rack plate 23 which has one or more openings 22-0 to permit air to be withdrawn by fans 21 and 22 from the interior of the cabinet 10 and exhausted to ambient. The edges 24 and 25 of rack plate 23 slide or are guided by a pair of spaced guide rails 26 and 27 which are formed as a part of or secured to vertical wall 13 by standard securement means well known in the art, such as, spot welds (sw). Electrical power to the fans or blowers is received from a power supply (not shown) via separate electrical conductors which may be plugged into a power supply 30. In the preferred embodiment, the power supply 30 is carried on a separate power supply drawer 31 so that it can be easily removed via its own guide rails 30-1 and 30-2 for maintenance, modification, etc., in the same way rack plate 23 carrying fans 21 and 22. Flanges or wings 32 and 33 on power supply drawer 31 are guided by spaced guide rails 30-1 and 30-2.

The cabinet 10 in this embodiment is for contention switching circuit which may be located in the cabinet and diagrammatically illustrated by element 45 in which a plurality of computer terminals (not shown) are selectively and individually connectable to a plurality of host computers. A plurality of rows of ports, diagrammatically illustrated at 40 (each of which is comprised of an RS232 connector socket) are mounted at an angle A to the vertical. The sockets are mounted on a connector circuit board shown in FIG. 1b with two rows of sixteen each RS232 connector sockets shown in FIG. 1a, which, in turn, has cable sockets for receiving connector cables to input output boards for the entire unit. A conventional card cage 41 is mounted near the rear of the cabinet and has slots (not shown) for receiving electronic circuit boards forming a part of the electronic circuitry for the contention circuit illustrated by element 45.

While a preferred embodiment of the invention has been disclosed, it will be appreciated that various modifications and adaptations of the invention will be apparent to those skilled in the art. For example, several fan drawers 20 can be mounted on the cabinet housing with one or more fans per drawer.

What is claimed is:

1. In a cabinet for electronic circuitry having blower means on at least one flat louvered wall, the improvement comprising:
    a pair of spaced guide rails means and means securing said pair of spaced guide rail means to said at least one flat louvered wall,
    a plate member having at least one opening therein and lateral edges,
    blower means mounted on said plate member in said at least one opening,
    said plate member having a width corresponding to the spacing between said spaced guide rails with said lateral edges sliding under said guide rails whereby said plate member and said blower means can slide between said pair of spaced guide rails and said blower means be easily removed for maintenance.

2. The cabinet for electronic circuitry as defined in claim 1, said cabinet having top and bottom horizontal walls secured to at least two side walls one of said walls constituting said at least one louvered wall,
    a second pair of spaced guide rails secured to said side walls and
    a power supply drawer means for carrying said electronic circuitry, said power supply drawer means having a width corresponding to the spacing between said second pair of guide rails and a pair of lateral wings sliding under said spaced guide rails, respectively.

3. The cabinet for electronic circuitry as defined in claim 1, further comprising a rear wall, a plurality of ports, said ports being mounted on said rear wall at an angle, said ports being arranged in a plurality of horizontal rows.

* * * * *